United States Patent [19]

Steinberg et al.

[11] 4,367,114

[45] Jan. 4, 1983

[54] HIGH SPEED PLASMA ETCHING SYSTEM

[75] Inventors: George N. Steinberg; Alan R. Reinberg, both of Westport; Jean Dalle Ave, Stamford, all of Conn.

[73] Assignee: The Perkin-Elmer Corporation, Norwalk, Conn.

[21] Appl. No.: 260,668

[22] Filed: May 6, 1981

[51] Int. Cl.³ ............................................. C23C 15/00
[52] U.S. Cl. ................................... 156/345; 156/643;
204/192 E; 204/298; 239/145; 219/121 PD;
219/121 PG
[58] Field of Search .............................. 156/345, 643;
204/192 E, 298; 222/3; 219/121 PD, 121 PG;
239/145

[56] References Cited

U.S. PATENT DOCUMENTS

| | | | |
|---|---|---|---|
| 3,503,557 | 3/1970 | Hutton | 239/145 |
| 4,209,357 | 6/1980 | Gorin et al. | 204/298 |
| 4,253,907 | 3/1981 | Parry et al. | 156/643 |
| 4,270,999 | 6/1981 | Hassan et al. | 156/643 |
| 4,307,283 | 12/1981 | Zajac | 156/345 |

FOREIGN PATENT DOCUMENTS 2026369 2/1980 United Kingdom ................ 156/643

OTHER PUBLICATIONS

'Plasma Etching Aluminum' Circuits Manufacturing, vol. 18 No. 4 (Apr. 78) pp. 39-42.
Crabtree et al, "Plasma ... A Review" Scanning Electron Microscopy, vol. I, 1978, pp. 543-554.

*Primary Examiner*—Jerome W. Massie
*Attorney, Agent, or Firm*—S. A. Giarratana; E. T. Grimes; T. P. Murphy

[57] ABSTRACT

This invention relates to a plasma etching system, which includes a lower flange and a spaced upper flange; a chamber wall mounted between the flanges to form a closed etching chamber; a grounded wafer support plate disposed in said chamber for receiving thereon a wafer to be processed; an electrical insulating element interposed between the chamber wall and the support plate; a sintered or sintered-like porous electrode plate mounted in the chamber in spaced relationship with respect to the wafer; said plate having a gas inlet for receiving a supply of etching gas; circuitry for applying an excitation voltage to this plate, and said chamber having a gas outlet leading to a vacuum source.

28 Claims, 1 Drawing Figure

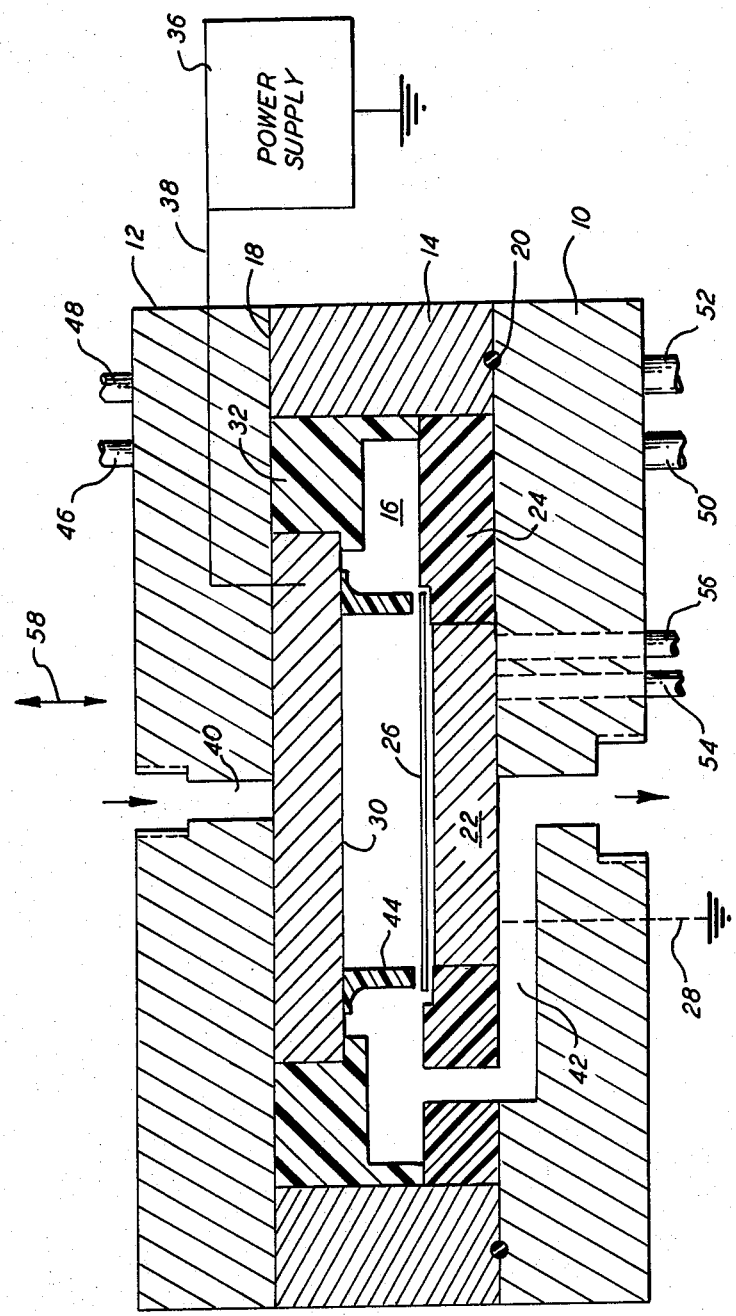

HIGH SPEED PLASMA ETCHING SYSTEM

BACKGROUND OF THE INVENTION

This invention relates to a high speed plasma etching system, which is particularly adapted, among other possible uses, for semiconductor manufacture.

While many different types of plasma etching systems have been employed heretofore with some success, our contribution to the art is a new system, which is an improvement over such known ones.

The invention has as one of its objectives, the provision of a new and improved high speed etching system, which is adapted to employ a substantially totally insulated substrate table and other grounded surfaces, to thereby prevent short-circuit discharge current from passing around the edges of the wafer and greatly reducing the etching rate.

The invention provides as another of its objectives, a system of the character aforesaid, which employs a sintered or sintered-like porous electrode plate to provide uniform omnidirectional gas dispersal without local strong discharge regions.

Further, as still another objective thereof, the invention provides a high speed plasma etching system, which can accommodate silicon wafers that are not perfectly flat, as a result of the provision of clamping means to assure proper coupling between the wafer and the wafer support plate.

One further objective of the invention resides in the provision of a new and improved etching system, which utilizes low frequency excitation current, resulting in increased ion motion and other beneficial effects. The high ion energies resulting from these effects are important for increasing etch rates, anisotropy and selectivity for silicon oxide etching with a variety of fluorocarbon etch gases.

These and other advantages of the system of the invention, as compared to etching systems heretofore utilized for the above-stated purposes, will become apparent as the discussion proceeds.

SUMMARY OF THE INVENTION

Briefly, our invention contemplates the provision of a new and improved high speed plasma etching system characterized by a lower flange and a spaced upper flange. A chamber wall is mounted between the flanges to form a closed etching chamber, and a wafer support plate is disposed in said chamber for receiving thereon a wafer to be processed. Means are provided for electrically grounding this plate. In addition, electrical insulating spacer means are interposed between the chamber wall and the support plate. The system further includes a sintered or sintered-like porous electrode plate, and means are provided for mounting the electrode plate in the chamber in space relationship with respect to the wafer. The plate has gas inlet means for receiving a supply of etching gas, and means are provided for applying an excitation operating voltage to said electrode plate. The chamber has a gas outlet leading to a vacuum source for discharging the gas and etching products.

In one form of the invention, the electrode plate is fabricated of sintered fine particles for omnidirectional effusion of the gas therefrom, such a plate being fabricated from any suitable material such as, for example, stainless steel, porous graphite, or porous sintered quartz.

According to another aspect of the invention, the system includes means for clamping the wafer firmly to the wafer support plate to enhance the electrical coupling of the wafer to ground.

As still another aspect of the invention, the frequency of the excitation voltage applied to the electrode plate is made sufficiently low so that the mechanism responsible for producing electron multiplication necessary for maintaining the discharge is surface controlled, rather than volume controlled.

There has thus been outlined rather broadly the more important features of the invention in order that the detailed description thereof that follows may be better understood, and in order that the present contribution to the art may be better appreciated. There are, of course, additional features of the invention that will be described more fully hereinafter. Those skilled in the art will appreciate that the conception on which this disclosure is based may readily be utilized as the basis for the design of other structures for carrying out the several purposes of the invention. It is important, therefore, that this disclosure be regarded as including such equivalent structures as do not depart from the spirit and scope of the invention.

Several embodiments of the invention have been chosen for purposes of illustration and description, and are shown in the accompanying drawing, forming a part of the specification.

BRIEF DESCRIPTION OF THE DRAWING

The FIGURE is a side elevational view, partially in schematic and partially in section, showing a high speed etching system constructed in accordance with the concepts of the present invention.

DETAILED DESCRIPTION OF THE PREFERRED EMBODIMENTS

In the embodiments of the invention illustrated in the drawing, the plasma etching system comprises a lower flange 10 and a spaced upper flange 12. A chamber wall 14 is mounted between said flanges to form a closed etching chamber 16. In one form of the invention, the upper edge of the chamber wall 14 is fixedly attached to the upper flange 12, as at 18, and an O-ring 20 serves to seal the lower edge of the chamber wall with respect to the lower flange 10.

A wafer support plate 22 is disposed in the etching chamber 16. This plate is mounted on the lower flange 10, and a ring-shaped electrical insulating spacer 24 is interposed between the chamber wall 14 and the support plate 22. The wafer support 22 is adapted to receive a wafer, indicated at 26 in the figure, to be processed. The support plate 22 is fabricated from an electrically conductive material and means, such as conductor 28, are provided for grounding the wafer, for purposes which will be explained more fully hereinafter. A sintered or sintered-like porous electrode plate 30 is mounted in the etching chamber 16 in spaced relationship with respect to the wafer. This plate is surrounded by an electrically insulated support ring 32, which serves to insulate it with respect to the chamber wall 14.

A power supply source 36 supplies an excitation operating voltage to the electrode plate 30 via conductor 38. The etching gas is supplied to the sintered or sintered-like porous plate 30 via gas inlet 40, provided for the purpose. The chamber 16 has a gas outlet 42 in the form of a plurality of spaced passages disposed around the wafer support plate 22, leading to a vacuum source, for discharging gas and etching products.

Resilient wafer hold down means 44 are provided, which may be in the form of spring loaded pins or a resiliently mounted ring, for purposes to be explained hereinafter.

For purposes of controlling the temperature of the etching process, the upper flange 12, lower flange 10, and wafer support plate 22 are each provided with cooling or heating passages. Thus, the upper flange 12 has a cooling inlet 46 and a cooling outlet 48, the bottom flange 10 has a cooling inlet 50 and outlet 52, and the wafer support plate 22 has a cooling inlet 54 and outlet 56. In some installations, it is desirable to use the inlet 50 and outlet 52 to supply heating fluid to the flange 10, while cooling fluid is supplied to the inlet 54 of the wafer support plate, whereas in other installations cooling fluid is supplied to both elements.

In operation, in order to remove a processed wafer 26 from the chamber 16 and replace it with a second wafer to be processed, the upper portion of the apparatus is moved vertically upwardly, as indicated by arrow 58 in the drawing. Thus, the upper flange 12, chamber wall 14, support ring 32, electrode plate 30 and hold down members 44 are arranged for upward movement as a single unit, while the lower flange 10, spacer 24, support plate 22 remain stationary, thereby to provide access to the wafer station.

It will be particularly appreciated that according to the present invention, the wafer support plate is totally electrically insulated. Silicon wafers are usually oxidized and therefore present a higher impedence to the plasma discharge than an uninsulated metal surface. The wafers are placed on a grounded surface. If exposed grounded metal surfaces are in contact with the plasma, a short-circuit discharge current will occur around the wafer and greatly reduce the etching rate. To prevent this, the ring-shaped insulating spacer 24 is provided to prevent exposure of the metal support plate 22, thereby assuring that substantially all of the discharge current passes to the wafer 26. Suitable insulating material for example, is Teflon (trademark) for fabricating the spacer 24, chamber walls 14 and support ring 32. Also, the clamping members 44 are fabricated of insulating material, such as Teflon (trademark), for example.

It will also be particularly appreciated that according to the present invention, the electrode 30 is a sintered or sintered-like porous plate. Electrode spacing for high rate etching is preferably made as small as possible to produce a high plasma space potential. In order to distribute the input gases as uniformly as possible, some type of shower head type of construction was heretofore considered desirable. However, we have found that if a series of drilled holes are used, even if they are small, local strong discharge regions are formed, which adversely affect uniformity. We have found that omnidirectional porous material is very desirable as a gas diffusion means. Suitable electrode plates can be fabricated of sintered fine particles to give uniform gas dispersal without local strong discharge regions. Suitable materials include sintered stainless steel, porous graphite and sintered quartz. It is noted that the electrode plate serves many functions as well as gas distribution, such as for example, the ability to vary the amount of gas delivered to a specific region of the wafer by varying the thickness of the plate. Thus, if natural non-uniformities exist due to differences in the electrical properties of the discharge, they can be compensated for by an appropriately machined plate. Additionally, the long contact time of the gas with the electrode allows it to be cooled by the electrode, whereby cool gas is delivered to the surface of the photoresist on the wafer. Since thermal degradation of photoresist is a prime limiting factor in plasma etching, this provides a more efficient method of cooling then by only conduction through the wafer from a cooled support plate.

Still another feature of the invention resides in the provision of wafer clamping means. Most silicon wafers are not perfectly flat and thus, contact the support plate in few places, at best. This results in a gap between the back of the wafer and the support plate. This gap results in reduced capacitance between the wafer and the support plate, whereby the wafer is partially "decoupled" from the ground. Further, clamping also prevents discharge current from short circuiting to the metal support plate under the wafer.

A further important feature of the invention resides in the use of low frequency excitation. At low frequency, in the 100 kilohertz region up to about 1 MHz, the operating voltage necessary to maintain a discharge increases above that which is necessary at higher radio-frequency such as 13.56 MHz. commonly used in prior art sputtering apparatus and in some prior art plasma etching apparatus. Consequently, ion motion increases at low frequency as the ions are able to follow changes in the field direction. The mechanism responsible for producing the electron multiplication necessary for maintaining the discharge shifts from a volume controlled mechanism to one which is surface controlled. That is, with high frequency volume control the ions cannot follow the rapidly changing current flow and so additional ionization is built up in the gas region between the plates, and with low frequency surface control the additional electrons to keep the discharge going are provided by so called secondary emission. The higher ion energy resulting from these effects are important for increasing etch rates, anisotropy (i.e., limiting etching to a single direction thereby reducing so-called undercutting) and selectivity for silicon oxide etching with a variety of fluorocarbon etch gases. In this regard, it will be appreciated that conventional prior art apparatus had an etch rate of from about 1000 to 2000 angstroms per minute, whereas apparatus constructed according to the concepts of the present invention have an etch rate in excess of several thousand angstroms per minute up to 1 micron per minute or higher (i.e., about 5 to 10 times the etch rate of the prior art).

As an example of one embodiment of the invention, the electrode or cathode plate 30 was constructed from sintered stainless steel with 0.5 micron pore size. Gaseous $C_2F_6$ mixed with argon was introduced into the chamber 16 through the porous electrode and a plasma initiated in the region between the bottom of the electrode and the top of an oxidized silicon wafer 26. Pressure in the chamber was 1.0 torr and excitation energy at 0.1 MHz. and 300 watts was employed. Very desirable results were obtained.

Although certain particular embodiments of the invention are herein disclosed for purposes of explanation, various modifications thereof, after study of this specification, will be apparent to those skilled in the art to which the invention pertains.

What is claimed and desired to be secured by Letters Patent is:

1. A plasma etching system comprising a lower flange and a spaced upper flange;
   a chamber wall mounted between said flanges to form a closed etching chamber;
   a wafer support plate disposed in said chamber for receiving thereon a wafer to be processed;
   means for electrically grounding said wafer support plate;
   means for clamping the wafer firmly to the wafer support plate to enhance electrical coupling of the wafer to ground;
   electrical insulating spacer means interposed between said chamber wall and said support plate;
   a sintered or sintered-like porous electrode plate, means for mounting said electrode plate in the chamber in spaced relationship with respect to the wafer; said plate having gas inlet means for receiving a supply of etching gas; means for applying an excitation operating voltage to said electrode plate; and
   said chamber having a gas outlet leading to a vacuum source for discharging gas and etching products.

2. A plasma etching system according to claim 1 wherein said means for mounting said electrode plate in the chamber comprises an electrically insulating support ring interposed between said electrode plate and said chamber wall.

3. A plasma etching system according to claim 1 wherein said electrode plate is fabricated of sintered fine particles for omnidirectional effusion of the gas therefrom.

4. A plasma etching system according to claim 3 wherein the pore size of the electrode plate is of the order of about 0.5 microns.

5. A plasma etching system according to claim 3 wherein said electrode plate is fabricated from stainless steel.

6. A plasma etching system according to claim 3 wherein said electrode plate is fabricated from porous graphite.

7. A plasma etching system according to claim 3 wherein said electrode plate is fabricated from porous sintered quartz.

8. A plasma etching system comprising a lower flange and a spaced upper flange;
   a chamber wall mounted between said flanges to form a closed etching chamber;
   a wafer support plate disposed in said chamber for receiving thereon a wafer to be processed;
   means for electrically grounding said wafer support plate;
   electrical insulating spacer means interposed between said chamber wall and said support plate;
   a sintered or sintered-line porous electrode plate, means for mounting said electrode plate in the chamber in spaced relationship with respect to the wafer; said plate having gas inlet means for receiving a supply of etching gas; means for applying an excitation operating voltage to said electrode plate;
   a plurality of spring loaded pins interposed between said elctrode plate and said wafer to resiliently clamp the wafer to the wafer support plate to enhance electrical coupling of the wafer to ground; and
   said chamber having a gas outlet leading to a vacuum source for discharing gas and etching products.

9. A plasma etching system according to claim 8 wherein said means for mounting said electrode plate in the chamber comprises an electrically insulating support ring interposed between said electrode plate and said chamber wall.

10. A plasma etching system according to claim 8 wherein said electrode plate is fabricated of sintered fine particles for omnidirectional effusion of the gas therefrom.

11. A plasma etching system according to claim 10 wherein the pore size of the electrode plate is of the order of about 0.5 microns.

12. A plasma etching system according to claim 10 wherein said electrode plate is fabricated from stainless steel.

13. A plasma etching system according to claim 10 wherein said electrode plate is fabricated from porous graphite.

14. A plasma etching system according to claim 10 wherein said electrode plate is fabricated from porous sintered quartz.

15. A plasma etching system comprising a lower flange and a spaced upper flange;
   a chamber wall mounted between said flanges to form a closed etching chamber;
   a wafer support plate disposed in said chamber for receiving thereon a wafer to be processed;
   means for electrically grounding wafer support plate;
   electrical insulating spacer means interposed between said chamber wall and said support plate;
   a sintered or sintered-like porous electrode plate, means for mounting said electrode plate in the chamber in spaced relationship with respect to the wafer; said plate having gas inlet means for receiving a supply of etching gas; means for applying and excitation operating voltage to said electrode plate;
   a resilient mounting ring interposed between said electrode plate and said wafer to resiliently clamp the wafer to the wafer support plate to enhance electrical coupling of the wafer to ground; and
   said chamber having a gas outlet leading to a vacuum source for discharging gas and etching products.

16. A plasma etching system according to claim 15 wherein said means for mounting said electrode plate in the chamber comprises an electrically insulating support ring interposed between said electrode plate and said chamber wall.

17. A plasma etching system according to claim 15 wherein said electrode plate is fabricated of sintered fine particles for omnidirectional effusion of the gas therefrom.

18. A plasma etching system according to claim 17 wherein the pore size of the electrode plate is of the order of about 0.5 microns.

19. A plasma etching system according to claim 17 wherein said electrode plate is fabricated from stainless steel.

20. A plasma etching system according to claim 17 wherein said electrode plate is fabricated from porous graphite.

21. A plasma etching system according to claim 17 rein said electrode plate is fabricated from porous sintered quartz.

22. A plasma etching system comprising a lower flange and a spaced upper flange;
   a chamber wall mounted between said flanges to form a closed etching chamber;
   a wafer support plate disposed in said chamber for receiving thereon a wafer to be processed;

means for electrically grounding said wafer support plate;

electrical insulating spacer means interposed between said chamber wall and said support plate;

a sintered or sintered-like porous electrode plate, means for mounting said electrode plate in the chamber in spaced relationship with respect to the wafer; said plate having gas inlet means for receiving a supply of etching gas; means for applying an excitation operating voltage to said electrode plate;

means for clamping the wafer firmly to the wafer support plate to enhance the electrical coupling of the wafer to ground, and wherein the frequency of said excitation operating voltage is in the range from about 100 KHz to about 1 KHz; and said chamber having a gas outlet leading to a vacuum source for discharing gas and etching products.

23. A plasma etching according to claim 22 wherein said means for mounting said electrode plate in the chamber comprises an electrically insulating support ring interposed between said electrode plate and said chamber wall.

24. A plasma etching system according to claim 22 wherein said electrode plate is fabricated of sintered fine particles for omnidirectional effusion of the gas therefrom.

25. A plasma etching system according to claim 23 wherein the pore size of the electrode plate is of the order of about 0.5 microns.

26. A plasma etching system according to claim 23 wherein said electrode plate is fabricated from stainless steel.

27. A plasma etching system according to claim 23 wherein said electrode plate is fabricated from porous graphite.

28. A plasma etching system according to claim 23 wherein said electrode plate is fabricated from porous sintered quartz.

* * * * *

UNITED STATES PATENT AND TRADEMARK OFFICE
CERTIFICATE OF CORRECTION

PATENT NO. : 4,367,114

DATED : January 4, 1983

INVENTOR(S) : George N. Steinberg et al

It is certified that error appears in the above-identified patent and that said Letters Patent is hereby corrected as shown below:

Column 5, line 54, change "sintered-line" to --sintered-like--.

line 66, change "discharing" to --discharging--.

Column 6, line 34, change "and" to --an--.

line 61, change "rein" to --wherein--.

Column 7, line 17, change "discharing" to --discharging--.

Signed and Sealed this

Fifth Day of April 1983

[SEAL]

Attest:

GERALD J. MOSSINGHOFF

Attesting Officer

Commissioner of Patents and Trademarks